(12) United States Patent
Kawachi et al.

(10) Patent No.: US 6,963,173 B2
(45) Date of Patent: Nov. 8, 2005

(54) LIGHT EMISSION TYPE DISPLAY APPARATUS

(75) Inventors: Genshiro Kawachi, Yokohama (JP); Takahiro Korenari, Yokohama (JP)

(73) Assignee: Advanced LCD Technologies Development Center Co., Ltd., Yokohama (JP)

(*) Notice: Subject to any disclaimer, the term of this patent is extended or adjusted under 35 U.S.C. 154(b) by 0 days.

(21) Appl. No.: 10/846,623

(22) Filed: May 17, 2004

(65) Prior Publication Data

US 2004/0233147 A1    Nov. 25, 2004

(30) Foreign Application Priority Data

May 20, 2003    (JP) ............................. 2003-141922

(51) Int. Cl.[7] ............................. G09G 3/10; G09G 3/36
(52) U.S. Cl. ..................................... 315/169.2; 345/92
(58) Field of Search .................. 315/169.1, 169.3; 313/500, 504, 505; 345/36, 39, 46, 55, 67, 345/76, 82, 92; G09G 3/10, 3/36

(56) References Cited

U.S. PATENT DOCUMENTS

| | | | | |
|---|---|---|---|---|
| 6,104,040 | A | * 8/2000 | Kawachi et al. | 257/59 |
| 6,307,322 | B1 | * 10/2001 | Dawson et al. | 315/169.1 |
| 2002/0066901 | A1 | * 6/2002 | Yamanaka et al. | 257/59 |
| 2003/0184238 | A1 | * 10/2003 | Osame et al. | 315/169.3 |

FOREIGN PATENT DOCUMENTS

JP    2002-156923    5/2002

* cited by examiner

*Primary Examiner*—Trinh Vo Dinh
(74) *Attorney, Agent, or Firm*—Oblon, Spivak, McClelland, Maier & Neustadt, P.C.

(57) ABSTRACT

An organic light emitting diode element and an EL drive transistor are arranged in each of a plurality of pixel areas defined by two adjacent scanning signal wirings and neighboring video signal wiring and current supply wiring. A current supplied to the organic light emitting diode element connected to a drain area of the drive transistor is controlled by a voltage between a gate electrode and a source electrode of the EL drive transistor, and a body electrode provided to the EL drive transistor as a fourth electrode is earthed in such a manner that excessive carriers generated in a channel area are caused to escape from the drive transistor through the body electrode.

10 Claims, 7 Drawing Sheets

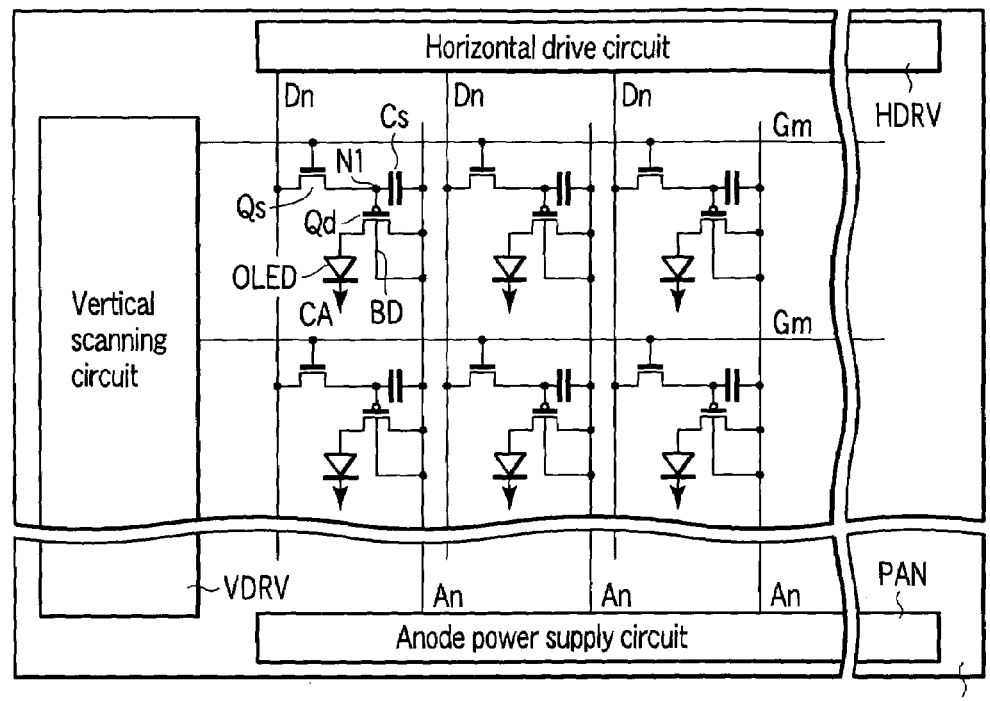
F I G. 1
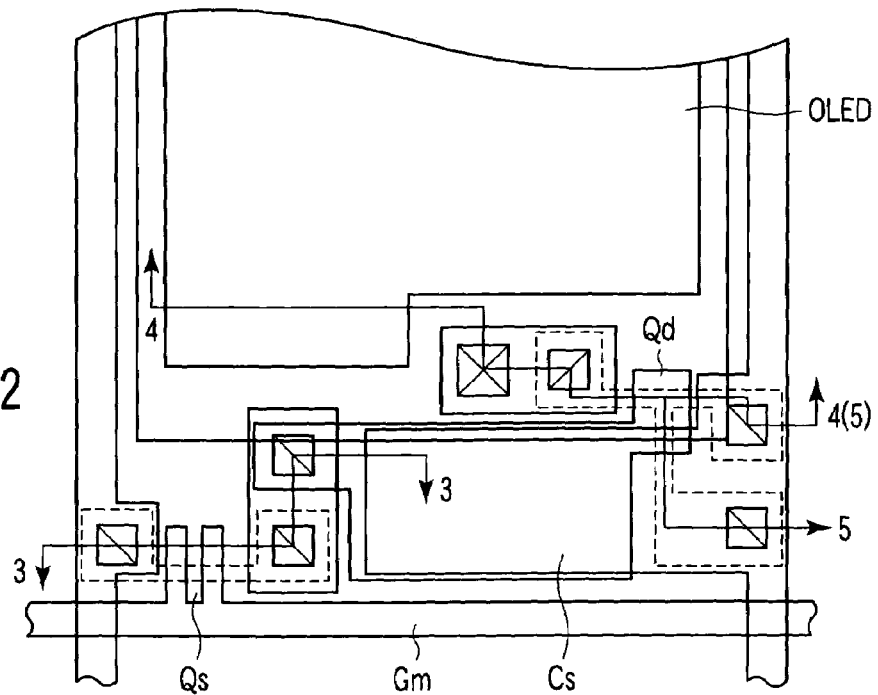
F I G. 2

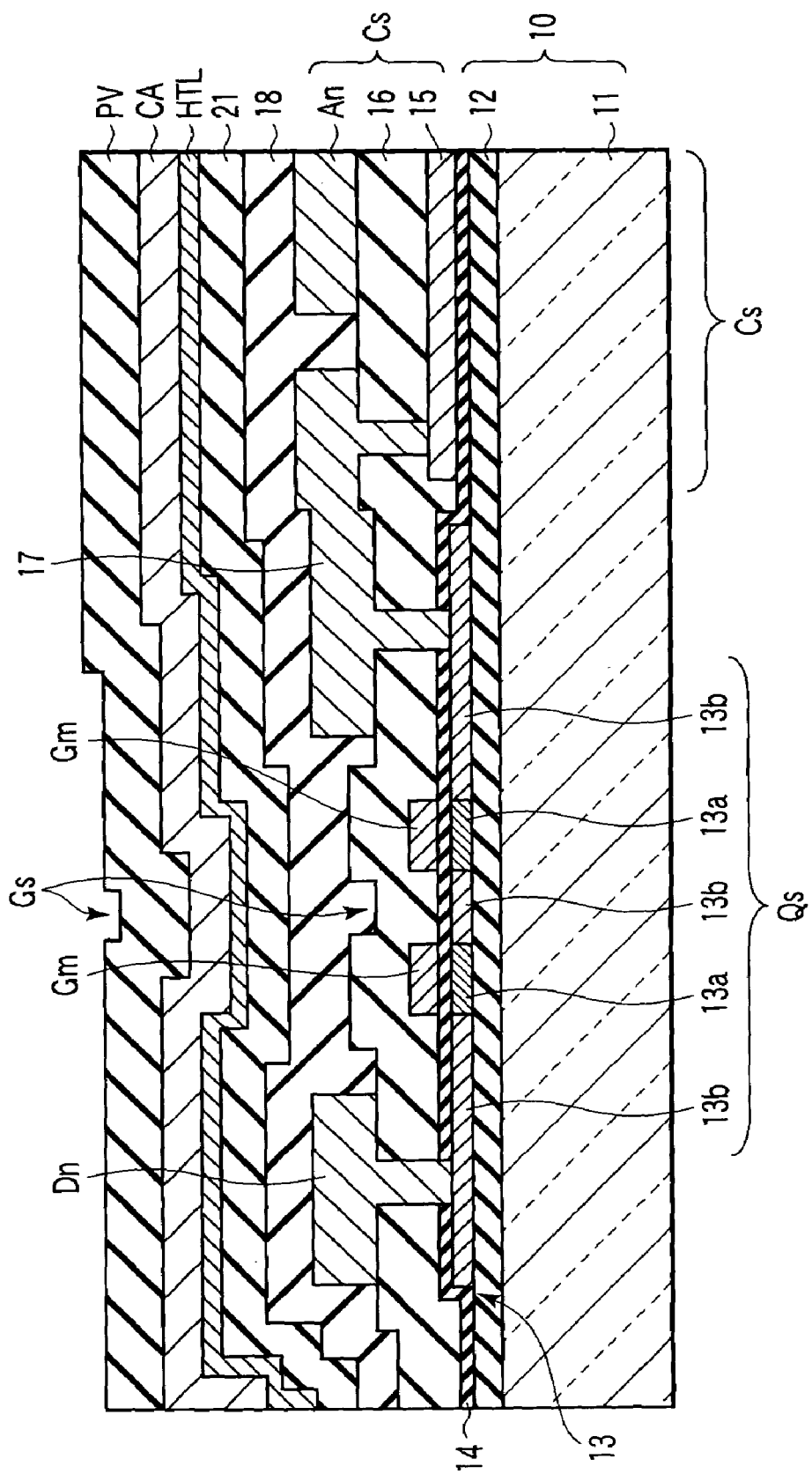
F I G. 3

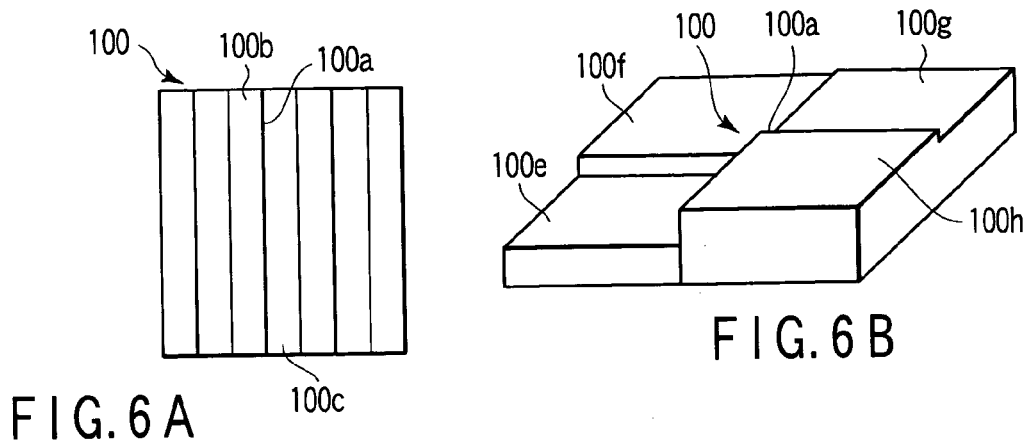
FIG. 6A
FIG. 6B
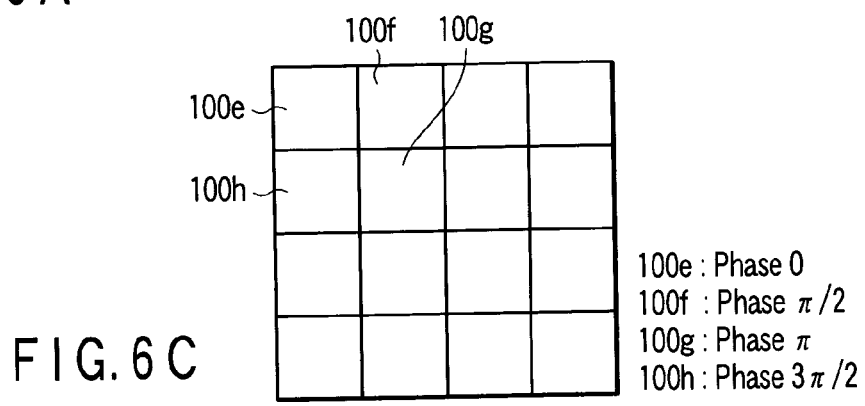
FIG. 6C
100e : Phase 0
100f : Phase $\pi/2$
100g : Phase $\pi$
100h : Phase $3\pi/2$
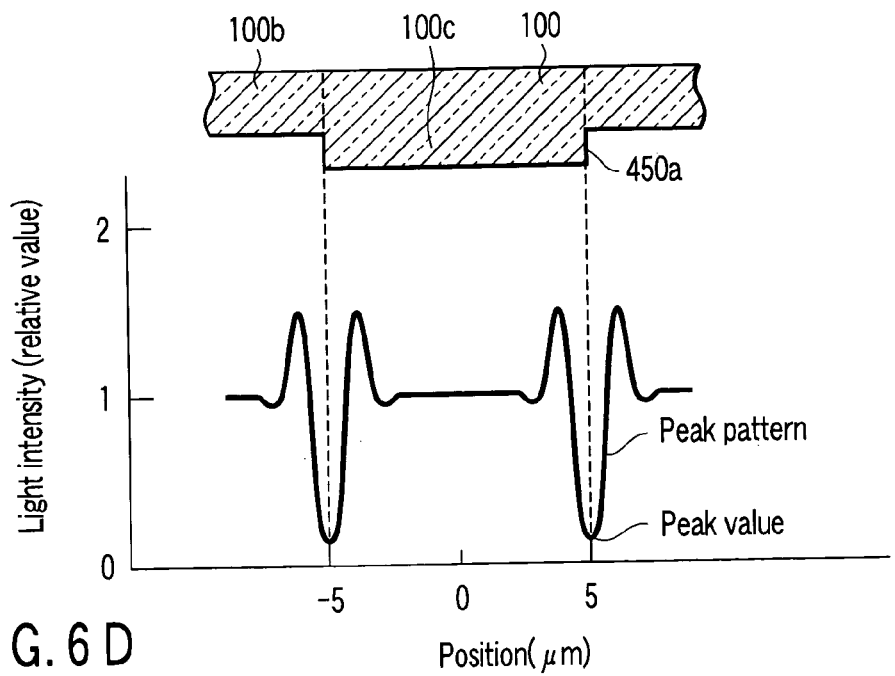
FIG. 6D

LIGHT EMISSION TYPE DISPLAY APPARATUS

CROSS-REFERENCE TO RELATED APPLICATIONS

This application is based upon and claims the benefit of priority from prior Japanese Patent Application No. 2003-141922, filed May 20, 2003, the entire contents of which are incorporated herein by reference.

BACKGROUND OF THE INVENTION

1. Field of the Invention

This invention relates to a light emission type display apparatus, for example, using light emitting diode arranged in a matrix form.

2. Description of the Related Art

Color image display apparatuses using an organic light emitting diode (which will be referred to as an OLED hereinafter) have recently attracted much attention. Among others, an active matrix type OLED display which drives many OLED elements arranged in a matrix form by using respective thin film transistors appears promising as a mode which is suitable for realization of a high definition and an increase in size.

As a pixel circuit of the active matrix type OLED display, there has been very commonly used a circuit which comprises two transistors and one capacitive element that is a sampling transistor which samples an analog image signal, a memory capacitance which stores an image signal and a drive transistor which controls a current which is supplied to an OLED in accordance with an image signal voltage stored in the memory capacitance. Jpn. Pat. Appln. KOKAI Publication No. 2002-156923 discloses an example of such a circuit configuration.

In the above-described prior art, an intensity of the current supplied to the OLED is controlled by applying an analog voltage held in the memory capacitance between a gate and a source of the drive transistor and driving the drive transistor in a saturation region, i.e., a region in which a voltage between a drain and the source becomes larger than a voltage between the gate and the source. By operating the drive transistor in the saturation region in this manner, a drop in a voltage between terminals of the OLED element varies due to a change in a current value, and a drive current value can be maintained at a fixed value even if the voltage between the source and the drain of the drive transistor varies. Therefore, the drive transistor must have excellent saturation characteristics. Here, the excellent saturation characteristics means that the voltage range in which the drain current can be fixed is wide, regardless of the voltage between the source and the drain.

Because of such a demand relative to the performance of the drive transistor, there is usually used a long-channel transistor whose channel length is very long, e.g., 10 $\mu$m to 20 $\mu$m as the drive transistor. That is because it is hard to obtain saturation characteristics that the drain current has a fixed value with respect to the voltage between the source and the drain, due to a channel length modulation effect or a parasitic bipolar effect when a channel length is short in a regular MOS type transistor. Further, another reason is that a breakdown voltage between the source and the drain is reduced as a result of an increase in an electric field in the vicinity of a drain junction due to a reduction in a channel length.

However, when long-channel transistor whose channel length is 10 $\mu$m to 20 $\mu$m is formed in a pixel, since an area occupied by the transistor is increased, an area in which an OLED element can be formed is decreased, thereby reducing an open area ratio. Therefore, a current density to be supplied to the OLED element must be increased in order to assure a fixed brightness, which results in a problem that a deterioration in the OLED elements is accelerated and a lifetime of a product is shortened.

BRIEF SUMMARY OF THE INVENTION

It is an object of the present invention to provide a light emission type display apparatus which can solve the above-described problems, comprises a transistor having excellent saturation characteristics and a high source-drain breakdown voltage without increasing a channel length to 10 $\mu$m to 20 $\mu$m, thereby effectively increasing a brightness or improve a life span.

To achieve this aim, a light emission type display apparatus according to one aspect of the present invention comprises:

a substrate having an electrical insulative surface;

a plurality of scanning signal wirings provided on the surface of the substrate;

a plurality of video signal wirings provided on the surface of the substrate to cross the scanning signal wirings;

a plurality of current supply wirings provided on the surface of the substrate to cross the scanning signal wirings;

light emission elements respectively arranged in a plurality of pixel areas each of which is defined by parts of the two adjacent scanning signal wirings and neighboring video signal wiring and current supply wiring; and a drive transistor which drives each of the light emission elements, the drive transistor having a channel layer, a gate electrode, a drain electrode provided in a drain area, a source electrode provided in a source area, and a body electrode, wherein a current which is supplied to the light emission element connected to the drain area of the drive transistor is controlled by a voltage between the gate electrode and the source electrode of the drive transistor, and the body electrode of the drive transistor is grounded in such a manner that excessive carriers generated in the channel layer are caused to escape from the drive transistor through the body electrode.

Preferably, the body electrode of the drive transistor is grounded when connected with the current supply wirings, or grounded when earth lines are provided on the surface (insulator surface) of the substrate and the body electrode is connected with these earth lines.

The main reason why a so-called SOI-MOS transistor provided on an insulator surface does not demonstrate an excellent saturation characteristics is that potential of a channel fluctuates, as will be described below, due to excessive carriers generated in an intense electric field in the vicinity of the drain junction. Taking an N channel transistor as an example, holes generated by an impact ionization in an intense electric field portion in the vicinity of the drain junction drift in a back channel toward the source electrode, and are banked up and stayed in the vicinity of an end of the back channel by a potential barrier existing at the source junction, whereby the potential of the channel is risen. Electrons inflow from the source so as to neutralize this and flow into the drain as they are, and hence a drain current is increased. When the drain current is increased, hole generation due to the impact ionization at the drain junction is enhanced. Therefore, the above-described series of processes become more prominent, and the drain current is suddenly increased.

By providing the body electrode to the drive transistor and connecting it to, e.g., a current supply terminal, as in one aspect of the present invention, excessive carriers generated in the transistor are taken to the outside and they no longer stay in the channel. Therefore, an inflow of excess electrons from the source does not occur, thereby achieving the excellent current saturation characteristics.

Objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a pixel circuit diagram of a light emission type display apparatus according to a first embodiment of the present invention;

FIG. 2 is a plane view showing a pixel part of the light emission type display apparatus according to the first embodiment of the present invention in an enlarged manner;

FIG. 3 is a cross-sectional view taken along the line 3—3 in FIG. 2;

FIGS. 6A to 6D are views illustrating an annealing process using a phase shift mask utilized in a method for forming a transistor according to the first embodiment, in which FIG. 6A is a plane view of a linear phase shift mask, FIGS. 6B and 6C are a perspective view and a plane view showing a modification of the phase shift mask, and FIG. 6D is a view showing an intensity distribution of laser beams obtained by the phase shift mask depicted in FIG. 6A;

DETAILED DESCRIPTION OF THE INVENTION

Figure 4:
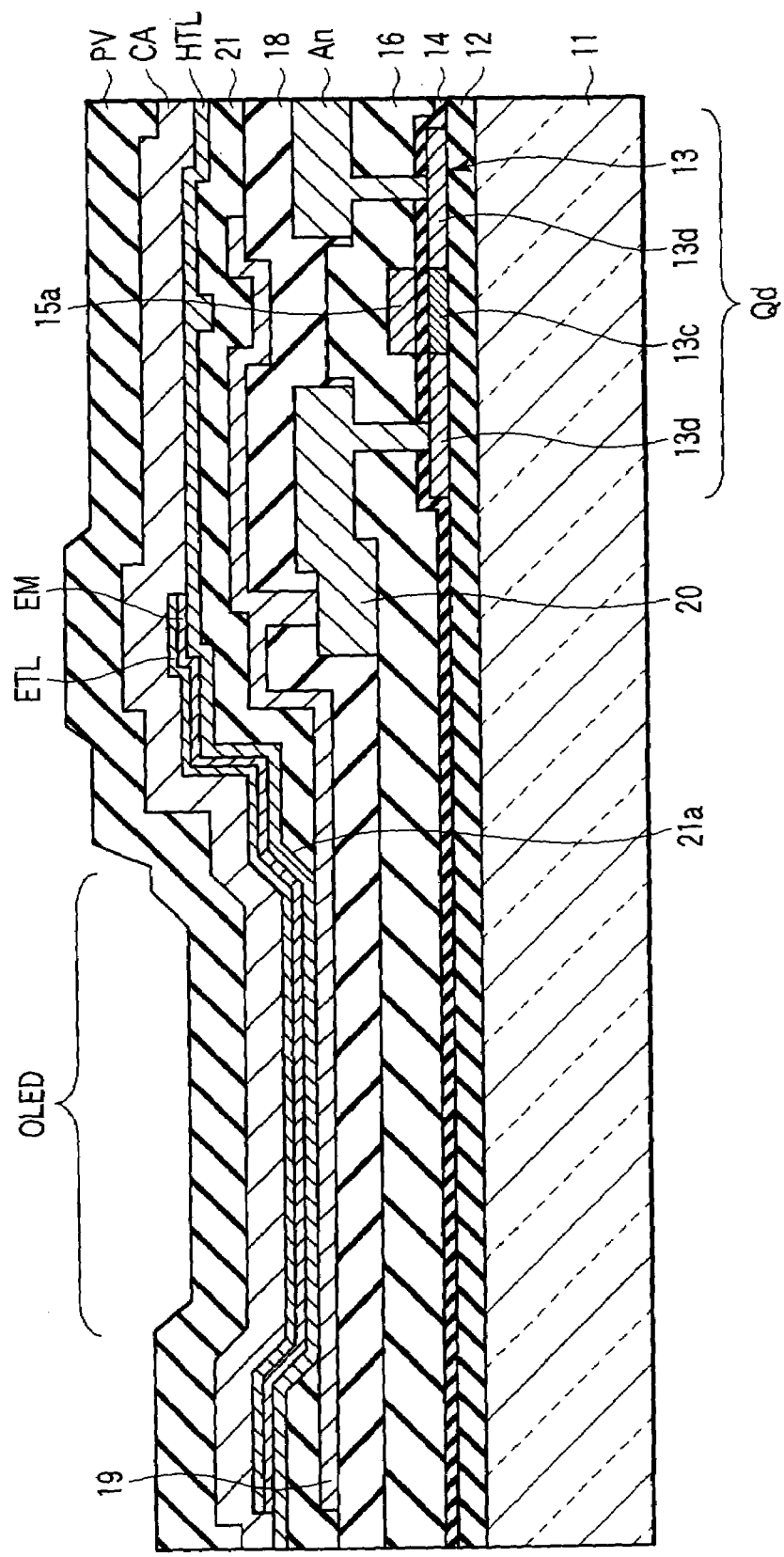
FIG. 4 is a cross-sectional view taken along the line 4—4 in FIG. 2.

Embodiments according to the present invention will now be described hereinafter with reference to the accompanying drawings.

(First Embodiment)

FIG. 1 shows an equivalent circuit of pixels of a light emission type display apparatus according to a first embodiment of the present invention. FIG. 2 is a plane view of a pixel of the light emission type display apparatus according to the first embodiment.

Many scanning signal wirings Gm extending in parallel with each other in a column direction, and many vide signal wirings Dn and anode current supply wirings An extending in parallel with each other in a row direction are arranged on an electrical insulating substrate (insulator surface) 10. Each of many pixels positioned in a matrix form is defined by an area surrounded by portions of two adjacent scanning signal lines Gm, one video signal wiring Dn and one anode current supply current An. A sampling transistor Qs, an EL drive transistor Qd, a charge storage capacitance Cs and an organic light emitting diode OLED are formed in each pixel. A terminal of one electrode (anode electrode) of the organic light emitting diode OLED is connected to a drain area of the EL drive transistor Qd, preferably through a drain electrode. Further, the charge storage capacitor Cs is connected between a gate terminal node N1 of the EL drive transistor Qd and the anode current supply wiring An so that a voltage of the gate terminal node N1 can be held for a fixed period. The other terminals of the organic light emitting diodes OLED of all the pixels are connected to a common cathode electrode CA which covers the substantially entire display area.

The sampling transistor Qs is constituted of a double gate NMOS (N type TFT) having a gate length of 1 $\mu$m+1 $\mu$m. Furthermore, the EL drive transistor Qd is constituted of a PMOS (P type TFT) having a gate length of 2 $\mu$m. A body electrode BD constituted of an n type semiconductor film is provided to the EL drive transistor Qd, and is connected to the anode current supply wiring An.

Moreover, a vertical scanning circuit VDRV, a horizontal drive circuit HDRV, and an anode power supply circuit PAN are arranged on the electrical insulating substrate 10. The scanning signal wirings Gm, the video signal wirings Dn and the anode current supply wirings An are respectively connected to the vertical scanning circuit VDRV, the horizontal drive circuit HDRV and the anode power supply circuit PAN. Additionally, all the anode current supply wirings An are grounded as well known when connected to the anode power supply circuit PAN.

In the display apparatus having the above-described structure, video analog signals are supplied from the horizontal drive circuit HDRV to pixels corresponding to one row selected by a pulse voltage from the vertical scanning circuit VDRV. These signals are held in the charge storage capacitor Cs through the sampling transistor Qs of each pixel. At this moment, a voltage between terminals of the charge storage capacitor Cs becomes equal to a voltage between a gate and a source of the EL drive transistor Qd, and a fixed current according to this voltage is supplied from the anode power supply circuit PAN to the organic light emitting diode OLED through the anode current supply wiring An and the EL drive transistor Qd. As a result, the organic light emitting diode OLED emits light beams, and a gray-scale image can be obtained.

A structure of an element of each pixel in the active matrix AMX (FIG. 6) will now be described in detail with reference to FIGS. 3 to 5.

Figure 5:
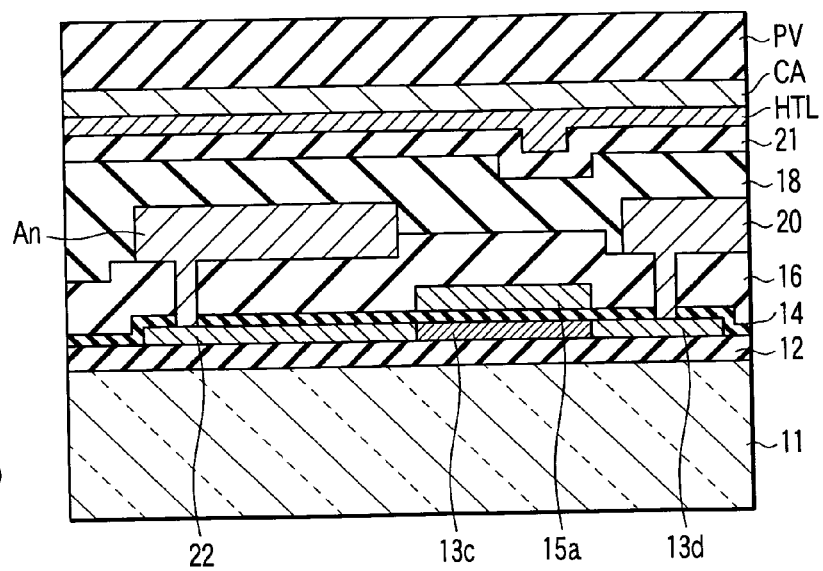
FIG. 5 is a cross-sectional view taken along the line 5—5 in FIG. 2.

FIG. 3 is a cross-sectional view taken along the line 3—3, FIG. 4 is a cross-sectional view taken along the line 4—4, and FIG. 5 is a cross-sectional view taken along the line 5—5 in FIG. 2.

The electrically insulating substrate 10 is constituted by forming a buffer insulating film made of an SiON film 12 having a film thickness of 200 nm on a no-alkali glass substrate 11 having a distortion point of approximately 670° C. The buffer insulating film has a function to prevent impurities such as Na from being diffused from the glass substrate 11 to the element. A single-crystal Si film 13 with a film thickness of 200 nm constituting the sampling transistor Qs is formed on the SiON film 12. A scanning wiring electrode (which is integrally formed with the scanning signal wiring Gm, and hence the same reference character Gm is given thereto) formed of tungsten (W) is formed on each single-crystal Si film 13 through a gate insulating film 14 formed of $SiO_2$ with a film thickness of 30 nm.

The sampling transistor Qs is an NMOS having a double gate structure, and has a structure in which two channel areas 13a are connected in series in one single-crystal Si film 13. $N^+$ type areas 13b constituting source and drain areas are formed on both sides of each channel area 13a.

Further, a first connection electrode 15 is formed on a part of the gate insulating film 14 which constitutes the charge storage capacitor Cs by using the same W as the scanning wiring electrode Gm.

An interlayer insulating film 16 formed of $SiO_2$ is formed on these members so as to cover all the members. On the interlayer insulating film 16 are provided signal wiring electrodes (each of which is integrally formed with the video signal wiring Dn, and hence the same reference character Dn is given thereto) formed of a three-layer metal film having Mo/Al/Mo or a Ti/Al—Cu alloy/Ti, second connection electrodes 17 and anode electrodes (each of which is integrally formed with the anode current supply current An, and hence the same reference character An is given thereto). The signal wiring electrode Dn is electrically connected with one n+ type area 13b through a contact through hole formed in the interlayer insulating film 16 and the gate insulating film 14. Furthermore, the second connection electrode 17 is electrically connected with the other n+ type area 13b through a contact through hole formed in the interlayer insulating film 16 and the gate insulating film 14. On end of the second connection electrode 17 is electrically connected with the first connection electrode 15 through a contact through hole formed in the interlayer insulating film 16 and the gate insulating film 14. The charge storage capacitor Cs is constituted of the first connection electrode 15, the anode current supply electrode An and a part of the interlayer insulating film 16 between the electrodes 15, An (FIG. 3).

On the other hand, the EL drive transistor Qd is a PMOS, and has a structure in which p+ type first areas 13d constituting source and drain areas are formed on both sides of one channel area 13c formed in a single-crystal Si film 13 (separated from the single-crystal Si film 13 constituting the sampling transistor Qs) as shown in FIG. 4. A gate electrode 15a of the EL drive transistor Qd is integrally formed with the first connection electrode 15. The anode current supply electrode An is connected to the p+ type first area 13d on the drain side of the EL drive transistor Qd through a contact through hole formed in the interlayer insulating film 16 and the gate insulating film 14. A third connection electrode 20 which is further provided on the interlayer insulating film 16 and formed of a three-layer metal film having Mo/Al/Mo or Ti/Al—Cu alloy/Ti is electrically connected with the p+ type first area 13d on the source side of this EL drive transistor Qd through a contact through hole formed in the interlayer insulating film 16 and the gate insulating film 14 on one end side of the third connection electrode 20.

A protection insulating film 18 is provided on the interlayer insulating film 16 including the upper surfaces of the various electrodes Dn, An, 17 and 20. An ITO electrode 19 which also functions as an anode electrode of the organic light emitting diode OLED is provided on the protection insulating film 18. The ITO electrode 19 is electrically connected with the other end side of the third connection electrode 20 through a contact hole formed in the protection insulating film 18. A bank insulating layer 21 is provided on the ITO electrode 19. An opening 21a is formed in the bank insulating film 21 so as to partially expose the ITO electrode 19, and organic films are superposed in an area where the opening 21a is formed, thereby forming the light emitting diode element OLED.

The organic film is formed of a low-molecular organic substance. Specifically, the organic films are a hole transfer layer HTL, an EL light emission layer EM and an electron transfer layer ETL which are sequentially superposed on the bank insulating film 21 and the anode electrode (ITO electrode) 19 exposed from the opening 21a of the bank insulating film 21. The organic light emitting diode OLED covers the entire display portion including the organic films, and has a cathode electrode CA formed of aluminium (AL). The hole transfer layer HTL is formed of, e.g., triphenyl diamine (TPD). The EL light emission layer EM is preferably constituted of a red color light emission layer, a blue color light emission layer and a green color light emission layer so as to perform color display. The red color light emission layer is formed of, e.g., tris(8-hydrooxyquinoline) aluminium($Alq_3$) obtained by doping DCJTB and rubrene. The blue color light emission layer is formed of, e.g., DPVBi obtained by doping $BC_ZVBi$. Moreover, the green color light emission layer is formed of, e.g., $Alq_3$ obtained by doping coumalin 540. The electron transfer layer ETL is formed of, e.g., $Alq_3$. These materials forming the light emission layers and the transfer layer are just examples, and they can be selected in many ways in accordance with applications. An exposed surface of the organic light emitting diode is covered with a final protection film PV constituted of an SiON film with a film thickness of 200 nm.

An n+ type area 22 is formed to the part of the single-crystal Si film 13 constituting the EL drive transistor Qd (FIG. 5). The n+ type area 22 is connected to the channel area 13c, and separated from the p+ type first areas 13d constituting the source and drain areas. This n+ type area 22 functions as the body electrode BD as a fourth terminal. The n+ type area 22 constituting the body electrode BD is connected with the anode current supply electrode An through a contact hole formed in the interlayer insulating film 16 and the gate insulating film 14.

In the light emission type display apparatus having the EL drive transistor Qd constituted as described above, the body electrode BD is provided to the EL drive transistor Qd, and is connected to the anode current supply electrode. As a result, excessive carriers generated in the EL drive transistor Qd are taken out by the anode current supply electrode, and thus, they no longer stay in the channel layer 13c. As a result, an inflow of electrons from the source area by the parasitic bipolar effect does not occur, and the excellent current saturation characteristics can be achieved even in the short-channel transistor whose gate length is as short as 2 μm. The body electrode BD of the EL drive transistor Qd of each pixel is provided for the purpose of only taking out excessive carriers, and hence all the body electrodes BD may be formed as a common body electrode. In particular, by connecting the body electrode BD to the anode current supply terminal, a wiring for the body electrode does not have to be additionally provided, which contributes to an improvement in an open area ratio of the pixel. Furthermore, using the short-channel transistor whose length is approximately 2 $\mu$m for the EL drive transistor contributes to an improvement in an open area ratio of the pixel.

An example of a method for manufacturing the active matrix having the above-described structure will now be described.

A no-alkali glass substrate 11 having a thickness of 500 $\mu$m, a horizontal width of 750 mm, a vertical width of 950 mm and a distortion point of approximately 670° C. is prepared. After cleansing this glass substrate 11, an SiON film 12 with a film thickness of 200 nm is formed on an upper surface of the substrate 11 by a plasma CVD method using a mixed gas of $SiH_4$, $NH_3$ and $O_2$. On the SiON film 12 is formed a substantially intrinsic hydrogenated amorphous silicon film 13 with a thickness of 200 nm by the plasma CVD method using a mixed gas of $SiH_4$ and an Ar gas. For example, determining a film formation temperature at this moment to 400° C. can set a hydrogen content after forming the film to approximately 5 at %. Then, hydrogen in the hydrogenated amorphous silicon film 13 is discharged by annealing the substrate (thus, silicon film 13) at 450° C. for approximately 30 minutes. Subsequently, the SiON film with the film thickness of 200 nm is formed as a cap layer used to avoid ablation in a next annealing process using laser beams is formed on the amorphous silicon film 13 by the plasma CVD method using an mixed gas of $SiH_4$, $NH_3$ and $O_2$. It is to be noted that the plasma CVD and the annealing step are continuously performed in a vacuum without exposing the glass substrate 11 to the atmosphere.

Then, irradiating the entire amorphous silicon film 13 or a part thereof with pulsed excimer laser beams having a wavelength of 308 nm can fuse and recrystallize silicon of this film, thereby obtaining a partially or entire single-crystallized single-crystal Si film 13. At this moment, in order to acquire a single-crystallized area having an area as large as possible, it is preferable to adopt a technique to give a spatial distribution to a laser beam intensity of the excimer laser beam on the substrate surface by using a phase shift mask having an appropriate pattern to give a temperature gradient in the lateral direction in the silicon film 13. As a result, a crystal growth in the lateral direction is provoked, thereby obtaining a substantially rectangular single-crystal area whose each side has a length of approximately 4 $\mu$m. A concrete example of the annealing method using the phase shift mask will be described later in detail.

Then, the SiON film as the cap layer is removed by using buffered hydrofluoric acid, and the single-crystal Si film 13 is formed into a predetermined pattern by a regular photolithography method.

Subsequently, an oxide film with a film thickness of 4 nm is formed on the upper surface of the single-crystal Si film 13 by plasma oxidization in a mixed gas of a Kr gas and $O_2$, and then an $SiO_2$ film with a film thickness of 24 nm is formed on this oxide film by the plasma CVD method using a mixed gas of tetraethoxysilane and $O_2$, thereby forming a gate insulating film 14 which is of a two-layer lamination type.

Then, boron ions ($B^+$) are implanted into the single-crystal Si film 13 with an acceleration voltage 20 KeV and a dose quantity of 2 E11 ($cm^{-2}$). It is to be noted that boron is used to adjust a threshold voltage of the TFT.

Subsequently, after forming an Mo film with a thickness of 250 nm on the gate insulating film 14 by a sputtering method, a predetermined resist pattern is formed on the Mo film by the regular photolithography method, and then the Mo film is processed into a predetermined shape by a reactive ion etching method using $CF_4$ in order to obtain a scanning wire electrode (scanning signal wiring) Gm, a first connection electrode 15 and a gate electrode 15a.

Then, phosphorus (P) ions are implanted into the single-crystal Si film 13 with an acceleration voltage of 40 KV and a dose quantity of 1 E15 ($cm^{-2}$) by an ion implantation method while keeping the resist pattern used for etching, and source and drain areas 13b of the N type sampling transistor Qs and a body area of the P type EL drive transistor (P type TFT) are formed.

Thereafter, the substrate is processed by using a mixed acid while keeping the resist pattern, and the processed Mo electrode is subjected to side etching in order to slim the pattern, thereby removing the resist. Then, phosphorus (P) ions are implanted into an exposed part of the single-crystal Si film 13 with an acceleration voltage 40 KV and a dose quantity of 1 E13 ($cm^{-2}$) by the ion implantation method, thus forming an LDD area of the sampling transistor (N type TFT). It is to be noted that a length of this LDD area is controlled by a side etching time using a mixed oxide like the above example.

Then, a predetermined resist pattern is formed in order to protect the sampling transistor Qs, and boron ions are implanted with an acceleration voltage of 20 kV and a dose quantity of 2 E15 ($cm^{-2}$) by using the gate electrode 15a of the EL drive transistor Qd as a mask, thereby forming p type source and drain areas 13d. At this moment, the source and drain areas 13d of the P type TFT are reversed from the n type to the p type by increasing an implantation quantity of boron ions to be larger than an implantation quantity of phosphorus ions, thus obtaining a P type MOS.

Subsequently, after removing the photoresist, impurities implanted in the single-crystal Si film 13 are activated by a rapid thermal annealing (RAT) method based on light UV irradiation of an excimer lamp or a metal halide lamp.

Then, an $SiO_2$ film with a film thickness of 500 nm is formed as an interlayer insulating film 16 on the entire upper surface by the plasma CVD method using a mixed gas of tetraethoxysilane and oxygen. After forming a predetermined resist pattern on this interlayer insulating film 16, a contact through hole is formed in the interlayer insulating film 16 by a dry etching method using $CHF_3$. Then, a Ti film with a thickness of 50 nm, an Al—Cu alloy film with a thickness of 500 nm and a Ti film with a thickness of 50 nm are sequentially superposed and formed on the interlayer insulating film 16 by the sputtering method. Thereafter, after forming a predetermined resist pattern on the Ti film, batch etching is performed by the reactive ion etching method using a mixed gas of $BCl_3$ and $Cl_2$, thereby forming a signal wiring electrode (video signal wiring) Dn, second and third connection electrodes 17 and 20 and an anode electrode An.

An $Si_3N_4$ film with a film thickness of 400 nm is formed as a protection insulating film 18 on the interlayer insulating film 16 including the upper surfaces of the respective electrodes Dn, 17, 20 and An by the plasma CVD method using a mixed gas of $SiH_4$, $NH_3$ and $N_2$. After forming a predetermined photoresist pattern on the protection insulating film 18, a contact through hole is formed in the protection insulating film 18 by a dry etching method using $SF_6$.

Subsequently, an ITO film with a thickness of 70 nm is formed on this protection insulating film 18 by a sputtering method, and this is processed into a predetermined shape by wet etching using a mixed acid, thereby obtaining an anode electrode 19 of the organic light emitting diode (LED) OLED.

Finally, an $Si_3N_4$ film having a film thickness of 100 nm is formed on the upper surface of the protection insulating film 18 including the anode electrode 19 by the plasma CVD method using a mixed gas of $SiH_4$, $NH_3$ and $N_2$. Then, after forming a predetermined photo-resist pattern on this $Si_3N_4$ film, the part of the $Si_3N_4$ film at the LED formation portion on the anode electrode 19 is removed by etching (an opening 21a is formed), thus acquiring a bank insulating film 21. It is to be noted that this bank insulating film 21 is formed in order to avoid destruction of the element due to an enhanced electric field at the ITO electrode edge portion when an ultra-thin organic film constituting the LED on the anode electrode 19 is formed by covering the edge portion of the anode electrode 19.

A description will now be given as to steps to form an organic LED element on the TFT active matrix substrate manufactured by the above-mentioned steps.

The substrate is set in a vacuum deposition device, introduced into a preliminary heating chamber and baked in a vacuum at 200° C. for one hour, thereby removing moisture attached on the substrate surface. Then, ultraviolet rays are emitted in an atmosphere including oxygen, and organic matter on the anode electrode surface is removed. Subsequently, the substrate is moved into a pre-processing chamber and subjected to $O_2$ plasma processing, thereby adjusting a work function of the anode electrode surface. By this processing, the work function of the ITO forming the anode electrode can be adjusted, a height of a barrier when electron holes are injected into an electron hole transfer material can be reduced, and an injection efficiency can be improved.

Then, the substrate is moved into a first vapor deposition chamber, and the hole transfer layer is subjected to mask vapor deposition by using a mask which is formed on an entire surface of the display portion. As a material of the hole transfer layer, triphenyldiamine (TPD) is used. Besides, α-NPD or the like can be used, for example. Subsequently, the substrate is moved into a second vapor deposition chamber, respective light emission materials of RGB are subjected to mask vapor deposition. In regard to film formation of the respective light emission materials, a dot which should display a blue color and an opening portion of the vapor deposition mask are positioned, then a blue color material is subjected to vapor deposition, the vapor deposition mask is shifted by a distance corresponding to a pitch of one dot in the vapor deposition chamber, a green color material is subjected to vapor deposition, the vapor deposition mask is further moved, and a red color material is subjected to vapor deposition. As a result, the predetermined materials are formed at respective dot positions of RGB.

Then, the substrate is moved into a third vapor deposition chamber, and a cathode electrode is formed. As to the cathode electrode, in order to improve an injection efficiency of electrons relative to an organic layer, LiF is formed with a film thickness of approximately 0.8 nm, and then an Al film is formed into a thickness of 150 nm. Finally, the substrate is moved into a CVD chamber, and an SiON film 12 with a film thickness of 300 nm is formed by the plasma CVD method using a mixed gas of $SiH_4$, $NH_3$ and $O_2$. At this moment, it is desirable to set a formation temperature to 100° C. or a lower temperature and form the film with a discharge power as small as possible in order to avoid damages to the organic LED element.

Finally, the substrate is cut into a predetermined size, and a driver LSI is mounted, thereby bringing a panel to completion.

A concrete example of the annealing step using the phase shift mask will now be described with reference to FIGS. 6A to 6D.

Adjacent areas with different thicknesses are provided to a transparent medium, e.g., a quartz substrate, and a phase shift mask 100 shown in FIG. 6A causes diffraction and interference of incoming laser beams on a boundary of steps (phase shift portion) between these areas and gives a cyclic spatial distribution to an intensity of the incident laser beams. This phase shift mask 100 has first strip areas (phase areas) 100b having a phase of Π and second strip areas (phase areas) 100c having a phase of 0 which are alternately aligned in such a manner that adjacent patterns have opposite phases. These strip areas (phase shift line areas) have a width of 10 µm. Specifically, the phase shift mask 100 was manufactured by pattern-etching a rectangular quartz substrate with a refractive index of 1.5 so as to obtain a depth with which a phase corresponds to Π with respect to light beams of 248 nm, i.e., a depth of 248 nm. An area formed thin by this etching becomes the first strip area 100b, and a non-etched area becomes the second strip area 100c.

In the phase shift mask 100 having such a structure, laser beams transmitted through the thick second phase area 100c are delayed from laser beams transmitted through the thin first phase area 100b by 180°. As a result, interference and diffraction occur between the laser beams, and such an intensity distribution of the laser beams as shown in FIG. 6D is obtained. That is, as to the light beams transmitted through the phase shift portion, since the transmitted light beams which are adjacent to each other have opposite phases, the light intensity becomes minimum, e.g., 0 at a position corresponding to a point between these areas. An area having a minimum light intensity or a neighboring area becomes a nucleus when crystallizing a semiconductor. In the concrete example, although the phase shift mask 100 in which the phase shift portion is formed of a plurality of straight lines parallel to each other is used as shown in FIG. 6A, the present invention is not restricted thereto.

For example, phase shift lines may be caused to be orthogonal to each other and the phases 0 and Π may be arranged in a lattice form. In this case, a lattice-like area with a light intensity of 0 is formed along the phase shift lines. Therefore, since a nucleus of a crystal is generated at an arbitrary position on the lines, there is a problem that a position and a shape of a crystal grain is hard to be controlled. Therefore, it is desirable that the area with the intensity of 0 has a dot-like form in order to control generation of the crystal nucleus. Thus, a phase shift quantity of the orthogonal phase shift lines is set to be less than 180°. As a result, the intensity cannot be completely 0 at a corresponding position of the phase shift line (although it is reduced) but, at the same time, the intensity at a position corresponding to the intersection can be set to 0 by setting a sum of complex transmittances around the intersection to 0.

An example of this structure will now be described with reference to FIGS. 6B and 6C. This mask 100 has a plurality of sets formed of a square pattern in which the respective sets are constituted of four square areas 100e, 100f, 100g and 100h with different thicknesses, as shown in FIG. 6B. In each set, the first area 100e is thinnest and has a phase of 0 as shown in FIG. 6C. The fourth area 100h is thickest and its phase is shifted from that of the first area 100e by 3Π/2. The second and third areas 100f and 100g which have thicknesses between the thicknesses of the areas 100e and 100h have phases shifted from those of the first area by Π/2 and Π, respectively.

In such a mask, a part at which the first to fourth areas are adjacent to each other, e.g., a center point of the square pattern becomes an area having an intensity of 0. Therefore, this point becomes a nucleus of a crystal, and a position and a shape of a crystal nucleus can be readily controlled. A technique using such a phase shift mask is described in the specification of the international application filed in Mar. 19, 2003 by the same applicant as the present applicant, with Japanese Application (Jpn. Pat. Appln. No. 2002-120312) being determined as a base application.

The entire light emission type display apparatus comprising an active matrix AMX having the above-mentioned structure will now be described with reference to FIG. 7.

An active matrix AMX having the above-described structure, a vertical scanning circuit VDRV and a horizontal drive circuit HDRV are formed on a rectangular glass substrate 11. A cathode electrode CA of an organic light emitting diode OLED of each pixel in the active matrix AMX is connected with an external connection terminal PAD through a contact area CACONT by a leader wiring WL formed on the substrate 11. Further, an anode current supply electrode An provided to each column in a pixel is connected outside a pixel area, and connected with the external connection terminal PAD by an extraction electrode. A final protection film PV is formed on the substantially entire surface of the cathode electrode CA except the external connection terminal PAD so that the organic light emitting diode element is not exposed to outside air, the cathode electrode CA being provided over the substantially entire area of the pixel area.

(Second Embodiment)

Figure 8:
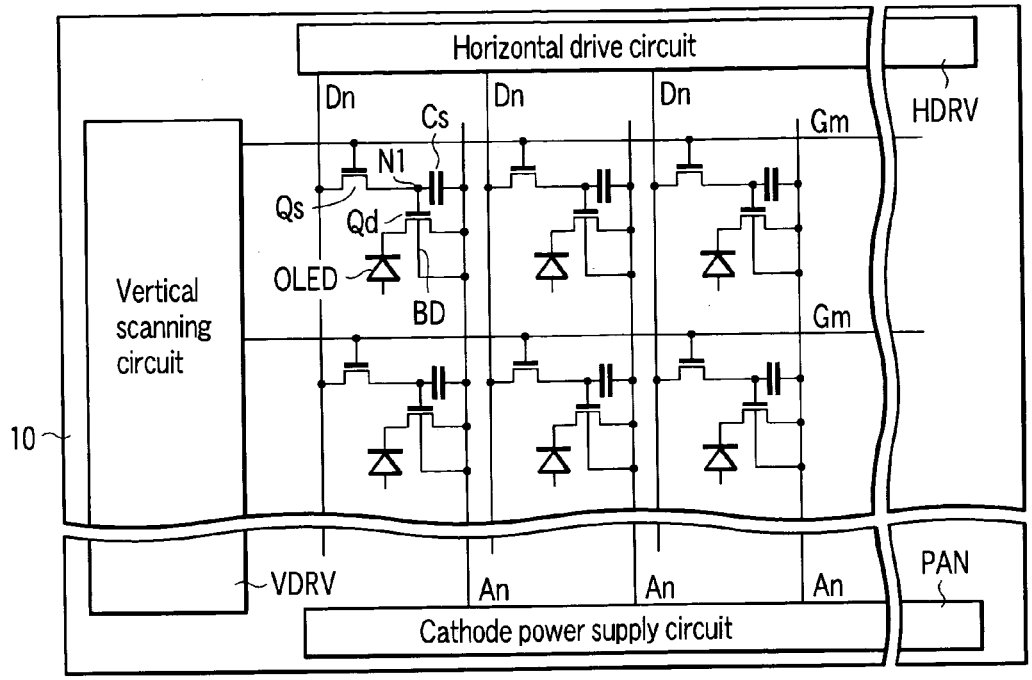
FIG. 8 is a pixel circuit diagram of a light emission type display apparatus according to a second embodiment of the present invention.

FIG. 8 shows an equivalent circuit of pixels of a light emission type display apparatus according to a second embodiment of the present invention. Although a structure of the second embodiment is substantially the same as that of the first embodiment, it is different from the first embodiment in that an NMOS is used for the EL drive transistor Qd. Furthermore, a cathode electrode of an organic light emitting diode OLED is connected to a drain terminal of this EL drive transistor Qd, and an anode electrode of the organic light emitting diode OLED is configured to function as a common electrode. Even in such a structure, by providing a body electrode BD to the EL drive transistor Qd and connecting this electrode with an anode current supply electrode An, excessive carriers generated in the EL drive transistor Qd are taken out by the anode current supply electrode An and they no longer stay in a channel layer. Therefore, an inflow of electrons from a source due to the parasitic bipolar effect does not occur, and the excellent current saturation characteristics are achieved even in a short-channel transistor whose gate length is approximately 2 μm. In particular, since non-saturation characteristics due to the parasitic bipolar effect are apt to be generated in an NNOS, this structure is effective.

Figure 7:
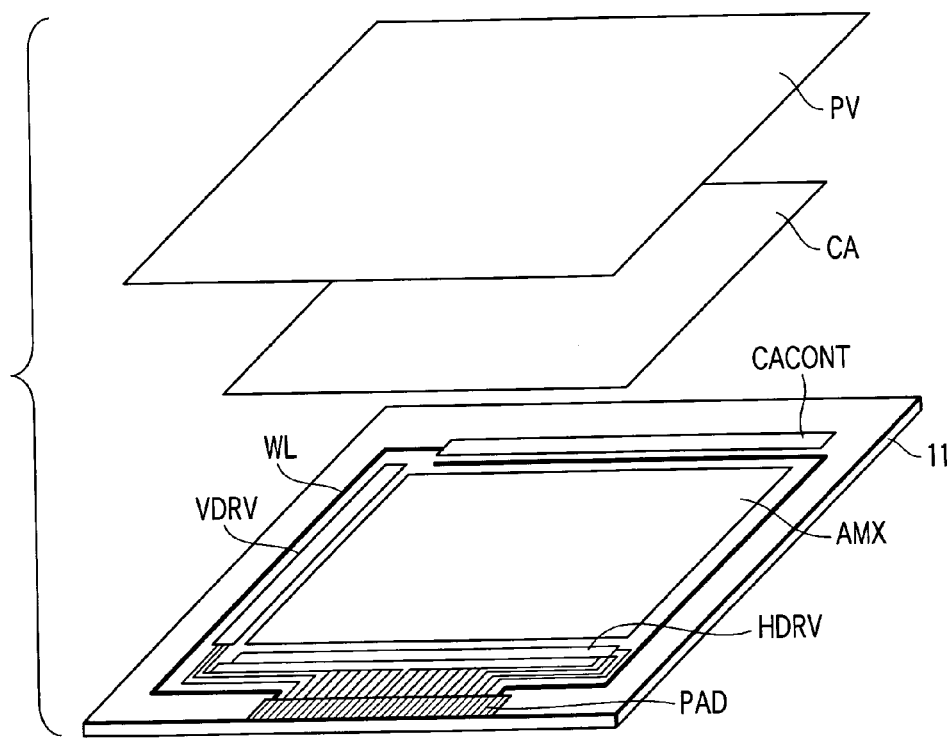
FIG. 7 is an exploded perspective view showing an entire light emission type display apparatus including an active matrix concerning the first embodiment.

In the light emission type display apparatus comprising the thus configured active matrix AMX, an anode electrode substitutes for a cathode electrode PV and is connected with an external connection terminal PAD through a contact area CACONT by a leader wirings WL formed on the substrate 11 in FIG. 7.

Figure 9:
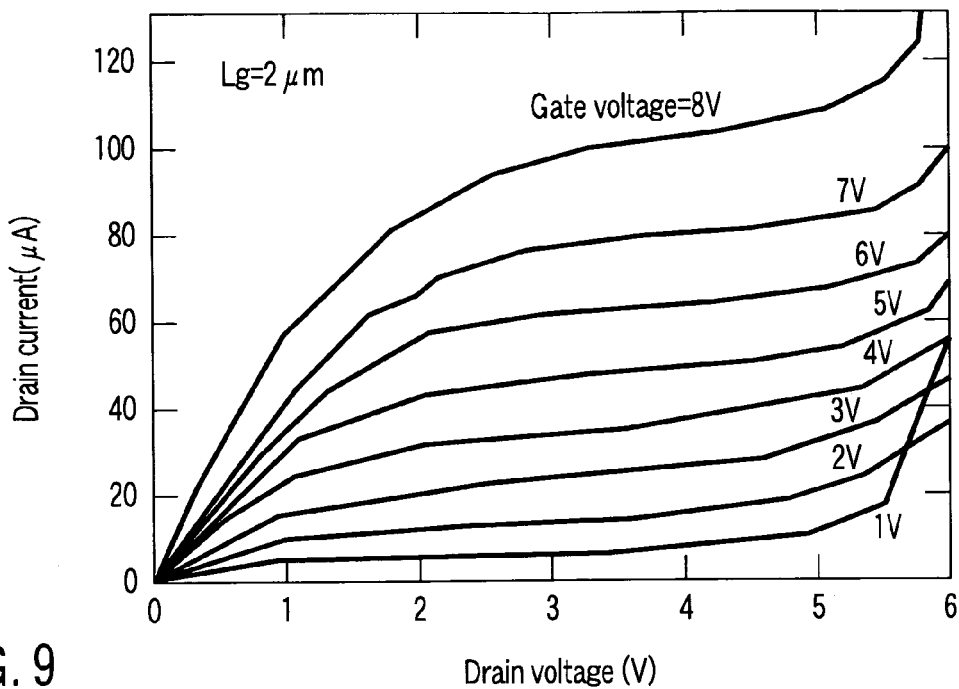
FIG. 9 is a view showing output characteristics of a conventional EL drive transistor.
Figure 10:
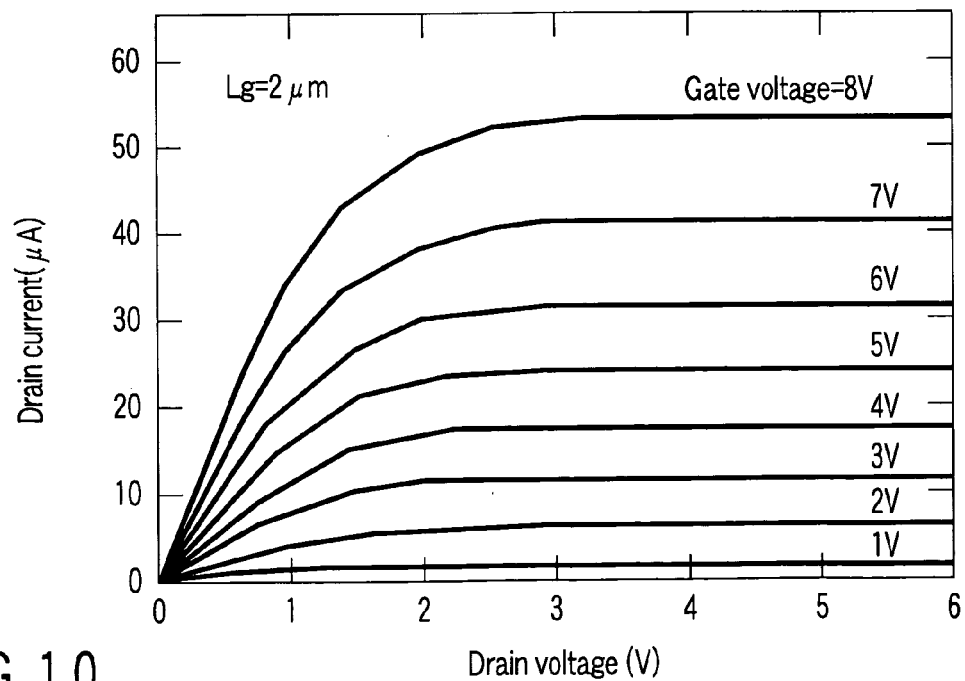
FIG. 10 is a view showing output characteristics of an EL drive transistor used in the light emission type display apparatus concerning the second embodiment of the present invention.

FIGS. 9 and 10 respectively show output characteristics in a case using an NMOS transistor having a conventional three-terminal structure as an EL drive transistor and a case using an NMOS transistor having a four-terminal structure according to the second embodiment as the EL drive transistor.

In the case of the NMOS transistor having the conventional three-terminal structure shown in FIG. 9, a saturation area in which a drain current becomes fixed with respect to a drain voltage due to occurrence of the parasitic bipolar effect is rarely observed, further a breakdown in a high-drain voltage area is observed. On the other hand, in the case of the four-terminal transistor according to this embodiment shown in FIG. 10, the excellent saturation characteristics can be observed in an extensive drain voltage, and a breakdown does not occur. Such characteristics are particularly desirable as a transistor used in a light emission type display apparatus which is of a fixed current drive type.

In the first and second embodiments, by connecting the fourth terminal of the EL drive transistor, i.e., the body electrode BD to the anode current supply wiring An, excessive carriers in the channel layer are discharged from this transistor. However, the present invention is not restricted to the connection with the wiring like, e.g., a third embodiment described below.

(Third Embodiment)

Figure 11:
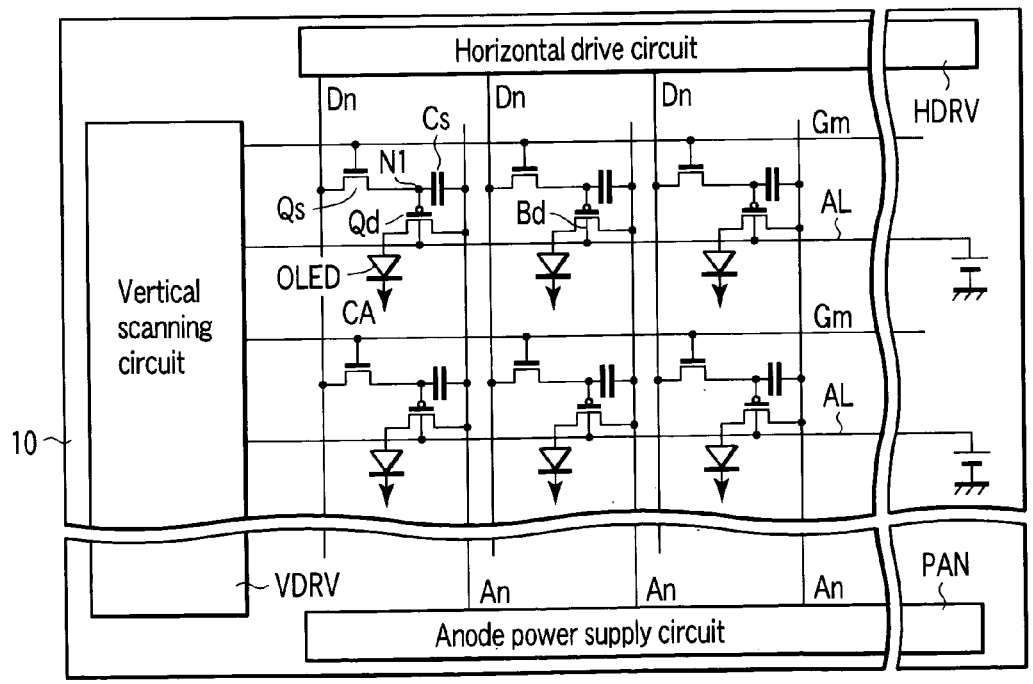
FIG. 11 is a pixel circuit diagram showing a light emission type display apparatus according to a third embodiment of the present invention.

In an active matrix shown in FIG. 11, like reference numerals denote members equal to those shown in FIG. 1, thereby eliminating the explanation.

An EL drive transistor Qd is a PMOS, and its body electrode BD is not connected to anode current supply wirings An. In place of this, earth lines AL are provided to an insulating substrate 10 in parallel with scanning signal wirings Gm, and the body electrode BD is connected with these earth line AL. These earth lines AL extend to the outside of the pixel area and are held at a power supply potential. It is to be noted that these earth lines AL can be formed of the same material as the scanning signal wirings Gm simultaneously with formation of the scanning signal wirings Gm.

The earth lines AL may be formed in parallel with video signal wirings Dn.

Excessive carriers generated in a channel layer of the EL drive transistor having such a structure are discharged, i.e., caused to escape from the transistor through the body electrode BD and the earth line AL. As a result, such advantages as shown in FIG. 10 can be obtained.

A technical idea of this embodiment can be also naturally applied to a case using an NMOS as the EL drive transistor Qd like the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A light emission type display apparatus comprising:
   a substrate having an electrical insulative surface;
   a plurality of scanning signal wirings provided on the surface of the substrate;
   a plurality of video signal wirings provided on the surface of the substrate so as to cross the scanning signal wirings;

a plurality of current supply wirings provided on the surface of the substrate so as to cross the scanning signal wirings;

light emitting elements each of which is arranged in each of a plurality of pixel areas defined by the two adjacent scanning signal wirings and neighboring video signal wiring and current supply wiring; and drive transistors which drive the light emitting elements, each of the drive transistors having a channel area, a gate electrode, a drain electrode provided on a drain area, a source electrode provided on a source area, and a body electrode, said channel area, said drain area, and said source area formed on a single crystal silicon film provided on one side of a respective drive transistor, a current supplied to the light emitting element connected to the drain area of the drive transistor being controlled by a voltage between the gate electrode and the source electrode of the drive transistor, and the body electrode of the drive transistor being earthed in such a manner that excessive carriers generated in the channel area are caused to escape from the drive transistor through the body electrode.

2. The light emission type display apparatus according to claim 1, wherein each of the light emitting elements has an EL light emitting diode.

3. The light emission type display apparatus according to claim 2, wherein the drive transistor has a P channel MOSTFT and the drain area thereof is connected to an anode electrode of the EL light emitting diode through the drain electrode.

4. The light emission type display apparatus according to claim 2, wherein the drive transistor has an N channel MOSTFT and the drain area thereof is connected to a cathode electrode of the EL light emitting diode through the drain electrode.

5. The light emission type display apparatus according to claim 1, wherein the body electrode is earthed by being connected with the current supply wiring.

6. The light emission type display apparatus according to claim 1, further comprising earth lines provided on the surface of the substrate, the body electrode being earthed by being connected with the earth line.

7. The light emission type display apparatus according to claim 1, wherein the channel area, the drain area, the source area and the body electrode are formed on a common semiconductor, and the channel area and the body electrode have an electroconductive type different from that of the drain area and the source area.

8. The light emission type display apparatus of claim 1, wherein said single crystal silicon film is formed by radiating an amorphous silicon film with a laser beam.

9. A light emission type display apparatus comprising:

a substrate having an electrical insulative surface;

a plurality of scanning signal wirings provided on the surface of the substrate;

a plurality of video signal wirings provided on the surface of the substrate so as to cross the scanning signal wirings;

a plurality of current supply wirings provided on the surface of the substrate so as to cross the scanning signal wirings; and drive transistors each of which is arranged in each of a plurality of pixel areas defined by the two adjacent scanning signal wrings and neighboring video signal wiring and current supply wiring and drives a sampling transistor which samples an image signal, a capacitance element which holds the image signal, a light emitting element thereof, each of the drive transistors having a channel area, a gate electrode, a drain area, a source area and a body electrode, said channel area, said drain area, and said source area formed on a single crystal silicon film provided on one side of a respective drive transistor, a current supplied to the light emitting element connected to the drain area of the drive transistor being controlled by a voltage between the gate area and the source area of the drive transistor, and the body electrode of the drive transistor being earthed in such a manner that excessive carriers generated in the channel area are caused to escape from the drive transistor through the body electrode.

10. The light emission type display apparatus of claim 9, wherein said single crystal silicon film is formed by radiating an amorphous silicon film with a laser beam.

* * * * *